US012206373B2

United States Patent
Jo et al.

(10) Patent No.: US 12,206,373 B2
(45) Date of Patent: Jan. 21, 2025

(54) DISTRIBUTED CIRCUIT

(71) Applicant: Nippon Telegraph and Telephone Corporation, Tokyo (JP)

(72) Inventors: Teruo Jo, Tokyo (JP); Munehiko Nagatani, Tokyo (JP); Hideyuki Nosaka, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 410 days.

(21) Appl. No.: 17/620,845

(22) PCT Filed: Jul. 8, 2019

(86) PCT No.: PCT/JP2019/026972
§ 371 (c)(1),
(2) Date: Dec. 20, 2021

(87) PCT Pub. No.: WO2021/005679
PCT Pub. Date: Jan. 14, 2021

(65) Prior Publication Data
US 2022/0416742 A1    Dec. 29, 2022

(51) Int. Cl.
*H03F 3/60*    (2006.01)
*H03D 7/12*    (2006.01)

(52) U.S. Cl.
CPC .............. *H03F 3/607* (2013.01); *H03D 7/125* (2013.01); *H03F 3/605* (2013.01)

(58) Field of Classification Search
CPC ...... H03F 3/607; H03F 2200/451; H03F 1/22; H03F 3/45085; H03F 3/605; H03F 3/19
(Continued)

(56) References Cited

U.S. PATENT DOCUMENTS 5,760,647 A * 6/1998 Miller ................. H03F 3/45179
330/252
7,924,097 B2 * 4/2011 Lender, Jr. .............. H03F 3/607
330/54
(Continued)

FOREIGN PATENT DOCUMENTS

JP    H6164249 A    6/1994
JP    2002033627 A    1/2002
(Continued)

OTHER PUBLICATIONS

Jeong, "Monolithic Distributed Amplifier With Active Control Schemes for Optimum Gain and Group-Delay Flatness, Bandwidth, and Stability," IEEE Transactions on Microwave Theory and Techniques, vol. 52, No. 4, Apr. 2004, pp. 1101-1110.
(Continued)

*Primary Examiner* — Andrea Lindgren Baltzell
*Assistant Examiner* — Khiem D Nguyen
(74) *Attorney, Agent, or Firm* — SLATER MATSIL, LLP

(57) ABSTRACT

A distributed amplifier includes: a transmission line having an input end that an input signal is input to; a transmission line having an output end that an output signal is output from; an input termination resistor connected to an end terminal of the transmission line; a plurality of unit cells arranged along the transmission lines, and having input terminals connected to the transmission line and output terminals connected to the transmission line; and a variable current source having one end connected to the end terminal of the transmission line and another end connected to a power supply voltage, and capable of adjusting a current amount between the transmission line and the power supply voltage.

13 Claims, 15 Drawing Sheets

(58) Field of Classification Search
USPC .......................................... 330/286, 295, 54
See application file for complete search history.

(56) References Cited

U.S. PATENT DOCUMENTS

| | | | |
|---|---|---|---|
| 2001/0002803 A1* | 6/2001 | Sato | ........................ H03F 3/607 |
| | | | 330/286 |
| 2002/0008583 A1 | 1/2002 | Shigematsu | |
| 2003/0184384 A1 | 10/2003 | Orr et al. | |
| 2012/0086511 A1* | 4/2012 | Nilsson | .................. H03H 11/28 |
| | | | 330/277 |

FOREIGN PATENT DOCUMENTS

| | | |
|---|---|---|
| JP | 2006054765 A | 2/2006 |
| JP | 2007280322 A | 10/2007 |
| JP | 2009260419 A | 11/2009 |

OTHER PUBLICATIONS

Giannakopoulos et al., "Ultra-Broadband Common Collector-Cascode 4-cell Distributed Amplifier in 250nm InP HBT Technology with over 200 GHz Bandwidth", Proceedings of the 12th European Microwave Integrated Circuits Conference, Nuremberg, Germany, Oct. 9, 2017, pp. 142-145.
Kobayashi et al., "A Novel HBT Distributed Amplifier Design Topology Based on Attenuation Compensation Techniques" IEEE Transactions on Microwave Theory and Techniques, vol. 42, No. 12, Dec. 1994, pp. 2583-2589.
Masuda et al. "An Over-110-GHz InP HEMT Flip-Chip Distributed Baseband Amplifier With Inverted Microstrip Line Structure for Optical Transmission System", IEEE Journal of Solid-State Circuits, vol. 38, No. 9, Sep. 2003, pp. 1479-1484.

* cited by examiner

-- PRIOR ART --

-- PRIOR ART --

-- PRIOR ART --

DISTRIBUTED CIRCUIT

CROSS-REFERENCE TO RELATED APPLICATIONS

This application is a national phase entry of PCT Application No. PCT/JP2019/026972, filed on Jul. 8, 2019, which application is hereby incorporated herein by reference.

TECHNICAL FIELD

The present invention relates to a distributed circuit such as a distributed amplifier and a distributed mixer.

BACKGROUND

Distributed circuits such as a distributed mixer and a distributed amplifier are excellently operable across a wide bandwidth and are used in various systems such as high-speed optical communication and high-resolution radars. The distributed circuits can amplify and mix signals across a wide bandwidth by making impedance matching in the state where parasitic capacitances of transistors are incorporated into input and output transmission lines, and furthermore, matching propagation constants of the input and output transmission lines.

In order to allow such a distributed circuit to operate appropriately, appropriate currents (collector currents in the case of bipolar transistors; drain currents in the case of field effect transistors) need to be caused to flow in the transistors used. FIG. 12 is a circuit diagram showing a configuration of a conventional distributed amplifier. The distributed amplifier is composed of: a transmission line CPW10 for input having an input end connected to a signal input terminal 1; a transmission line CPW20 for output having an end terminal connected to a signal output terminal 2; an input termination resistor R1 connecting an end terminal of the transmission line CPW10 and the ground; an output termination resistor R2 connecting an input end of the transmission line CPW20 and the ground; a plurality of unit cells 3-1 to 3-N arranged along the transmission lines CPW10 and CPW20, and having input terminals connected to the transmission line CPW10 and output terminals connected to the transmission line CPW20; and a bias tee 4 which supplies a bias voltage to input transistors in the unit cells 3-1 to 3-N. In the example of FIG. 12, N stages of unit cells 3 (3-1 to 3-N) are provided. The transmission line CPW10 is composed by a configuration in which a plurality of transmission lines CPW1$a$, CPW1 and CPW1$b$ are connected in series. Likewise, the transmission line CPW20 is composed by a configuration in which a plurality of transmission lines CPW2$a$, CPW2 and CPW2$b$ are connected in series.

As shown in FIG. 13, each of the unit cells 3 (3-1 to 3-N) is composed of: an input transistor Q30 having a base terminal connected to the transmission line CPW10; an output transistor Q31 having a collector terminal connected to the transmission line CPW20 and an emitter terminal connected to a collector terminal of the input transistor Q30; an emitter resistor REE having one end connected to an emitter terminal of the input transistor Q30 and the other end connected to a power supply voltage VEE; a resistor R30 having one end connected to the power supply voltage VEE and the other end connected to a base terminal of the output transistor Q31; a resistor R31 having one end connected to the base terminal of the output transistor Q31 and the other end connected to the ground; and a capacitor C30 having one end connected to the base terminal of the output transistor Q31 and the other end connected to the ground.

In the case of the distributed amplifier as in FIG. 12, for example, realized by an integrated circuit (IC), in order to cause an appropriate current to flow in the transistors Q30 and Q31 of each unit cell 3, an appropriate bias voltage needs to be applied to the base terminal of the input transistor Q30 of each unit cell 3. When the bias voltage of the input transistor Q30 is applied, in order not to be affected by a DC voltage of an upstream circuit, the off-chip bias tee 4 which cuts off the DC voltage is used (refer to Non-Patent Literature 1). As shown in FIG. 12, the bias tee 4 is composed of a capacitor C1 inserted between the signal input terminal 1 and the input end of the transmission line CPW10, and an inductor L1 having one end connected to the input end of the transmission line CPW10 and the other end connected to a bias voltage vbin.

FIG. 14 and FIG. 15 are circuit diagrams showing other configurations of conventional distributed amplifiers. In the configuration of FIG. 14, in order to cause a DC current not to flow in the transmission line CPW10, a capacitor C2, in addition to the configuration in FIG. 12, is inserted between the input termination resistor R1 and the ground (refer to Non-Patent Literature 2).

In the configuration of FIG. 15, a DC block 5 composed of the off-chip capacitor C1 is solely provided at the input end of the transmission line CPW10, and in order to apply an appropriate bias voltage to the input transistor Q30 of each unit cell 3, a bias voltage Vbb is supplied to the end terminal of the transmission line CPW10 via the input termination resistor R1 and a wire 6 (refer to Non-Patent Literature 3).

As above, there are proposed some schemes as shown in FIG. 12, FIG. 14 and FIG. 15 as a scheme for supplying the bias voltage. There nevertheless have been some problems below on the respective configurations shown in FIG. 12, FIG. 14 and FIG. 15.

With the configuration of the distributed amplifier shown in FIG. 12, since a DC current flows from the inductor L1 of the bias tee 4 to the input termination resistor R1 through the transmission line CPW10, a voltage drop arises due to the parasitic resistance of the transmission line CPW10. With the configuration in FIG. 12, when common emitter circuits are used, for example, as the circuits of the input transistors of the unit cells 3, the aforementioned voltage drop makes the voltages at the base terminals of the input transistors of the unit cells 3 uneven, which has caused a problem that the gain of the distributed amplifier decreases.

The phenomenon that the gain decreases can be explained as follows. The values of voltages are different between the bias tee 4 side and the input termination resistor R1 side due to the voltage drop arising in the transmission line CPW10. In the unit cells 3, collector currents flow in the input transistors Q30, base voltages Vic of the input transistors Q30 of the unit cells 3 are uneven since the values of voltages are different between the bias tee 4 side and the input termination resistor R1 side, and hence, the values of the collector currents are also uneven. In the case where a current flows from the inductor L1 to the input termination resistor R1, the collector current flowing in the input transistor Q30 of the first-stage unit cell 3-1 is larger than the collector current flowing in the input transistor Q30 of the Nth-stage unit cell 3-N. There are optimal collector currents value for obtaining the maximum gains of transistors generally. The configuration in FIG. 12 nevertheless causes the gains to decrease since a unit cell closer to the end terminal side more has a deviation from the optimal collector current value due to the unevenness in collector current as described above.

In the configuration of the distributed amplifier shown in FIG. 14, the capacitor C2 is inserted between the input termination resistor R1 and the ground in order to cause a DC current not to flow in the transmission line CPW10. Nevertheless, Since the configuration in FIG. 14 cannot realize a large capacitance value of the on-chip capacitor C2, there has been a problem that a reflection property on the low frequency side deteriorates. It is not desirable to employ the configuration in FIG. 14 for amplifying and mixing baseband signals that need excellent reflection properties ranging from those at low frequencies because of the problem of the deterioration in reflection property.

Moreover, the configuration of the distributed amplifier shown either in FIG. 12 or FIG. 14 employs the bias tee 4, and the self-resonant frequency of the bias tee 4 needs to be made high in view of realization of a wide bandwidth of a distributed circuit. Making the self-resonant frequency high nevertheless has been difficult since the bias tee 4 needs a large inductor L1.

In the configuration of the distributed amplifier shown in FIG. 15, the DC block 5 is provided at the input end of the transmission line CPW10, and the bias voltage Vbb is supplied to the end terminal of the transmission line CPW10 via the input termination resistor R1 and the wire 6. With this configuration in FIG. 15, a large DC current does not flow in the transmission line CPW10 and a bias voltage is evenly applied to the unit cells 3. There nevertheless has been a problem on the configuration in FIG. 15 that a reflection property on the high frequency side deteriorates since the long wire 6 needs to be drawn between the terminal which the bias voltage Vbb is applied to and the input termination resistor R1. It is not desirable to employ the configuration in FIG. 15 for amplifying and mixing high-speed baseband signals because of the problem of the deterioration in reflection property. As above, it has been difficult for the conventional configurations to apply a bias voltage to the input transistors of the unit cells 3 without causing the gain or the reflection properties to deteriorate.

CITATION LIST

Non-Patent Literature

Non-Patent Literature 1: Satoshi Masuda, Tsuyoshi Takahashi, and Kazukiyo Joshin, "An over-110-GHz InP HEMT flip-chip distributed baseband amplifier with inverted microstrip line structure for optical transmission system", IEEE Journal of Solid-State Circuits, Vol. 38, No. 9, pp. 1479-1484, 2003;

Non-Patent Literature 2: Kevin W. Kobayashi, Reza Esfandiari, and Aaron K. Oki, "A novel HBT distributed amplifier design topology based on attenuation compensation techniques", IEEE transactions on microwave theory and techniques, Vol. 42, No. 12, pp. 2583-2589, 1994; and Non-Patent Literature 3: Stavros Giannakopoulos, et al., "Ultra-broadband common collector-cascode 4-cell distributed amplifier in 250 nm InP HBT technology with over 200 GHz bandwidth", 2017 12th European Microwave Integrated Circuits Conference (EuMIC), IEEE, 2017.

SUMMARY

Technical Problem

Embodiments of the present invention are devised in order to solve some problem(s) above, and an object thereof is to make it possible to apply an appropriate bias voltage to input transistors of unit cells and to cause a distributed circuit to operate without causing a gain or a reflection property to deteriorate.

Means for Solving the Problem

There is provided a distributed circuit of embodiments of the present invention, including: a first transmission line having an input end that an input signal is input to; a second transmission line having an output end that an output signal is output from; a termination resistor connected to an end terminal of the first transmission line; a plurality of unit cells arranged along the first and second transmission lines, and having input terminals connected to the first transmission line, and output terminals connected to the second transmission line; and a first variable current source having one end connected to the end terminal of the first transmission line or a vicinity of the end terminal and another end connected to a power supply voltage, and capable of adjusting a current amount between the first transmission line and the power supply voltage.

Effects of Embodiments of the Invention

According to embodiments of the present invention, by providing the first variable current source having one end connected to the end terminal of the first transmission line or the vicinity of the end terminal and the other end connected to the power supply voltage, it is made possible to apply an appropriate bias voltage to input transistors of unit cells and to cause the distributed circuit to operate without causing a gain or a reflection property to deteriorate.

DETAILED DESCRIPTION OF ILLUSTRATIVE EMBODIMENTS

First Embodiment

Figure 1:
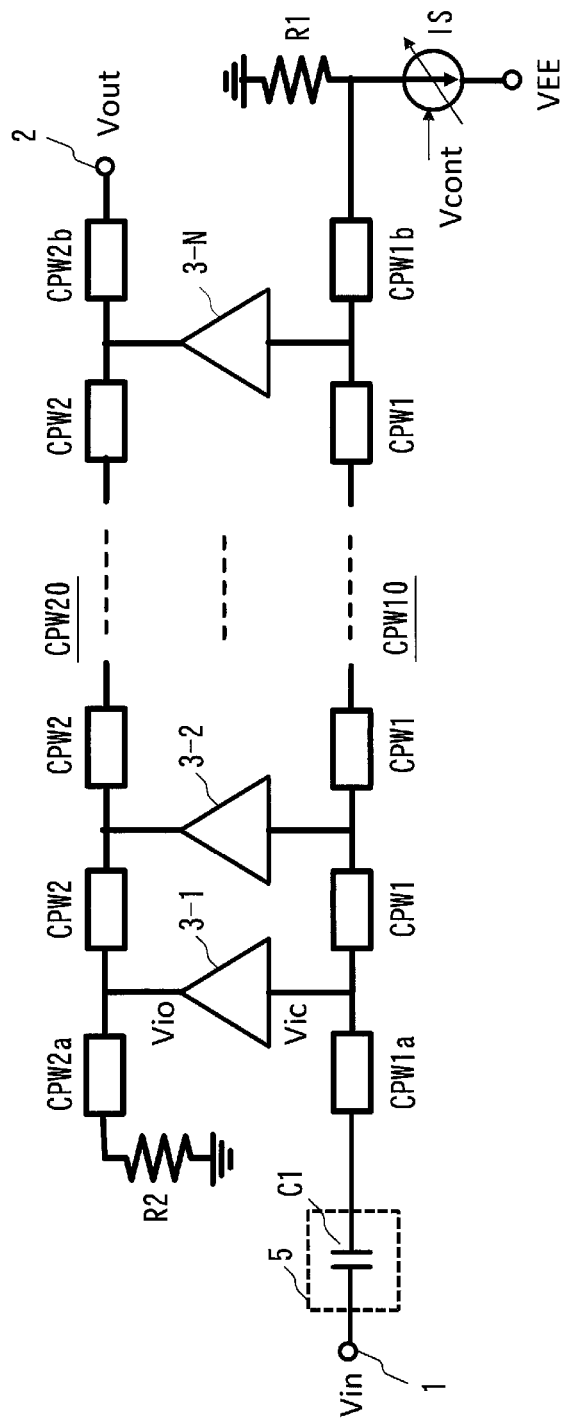
FIG. 1 is a circuit diagram showing a configuration of a distributed amplifier according to a first embodiment of the present invention.

Hereafter, embodiments of the present invention are described with reference to the drawings. FIG. 1 is a circuit diagram showing a configuration of a distributed amplifier according to a first embodiment of the present invention. The distributed amplifier of the presented embodiment is composed of: a transmission line CPW10 for input; a transmission line CPW20 for output; an input termination resistor R1; an output termination resistor R2; a plurality of unit cells 3-1 to 3-N; a DC block 5; and a variable current source IS. The transmission line CPW20 has an end terminal connected to a signal output terminal 2. The input termination resistor R1 connects an end terminal of the transmission line CPW10 and the ground. The output termination resistor R2 connects an input end of the transmission line CPW20 and the ground. The unit cells 3-1 to 3-N are arranged along the transmission lines CPW10 and CPW20, and have input terminals connected to the transmission line CPW10, and output terminals connected to the transmission line CPW20. The DC block 5 is composed of an off-chip capacitor C1 inserted between a signal input terminal 1 and an input terminal of the transmission line CPW10. The variable current source IS has one end connected to the end terminal of the transmission line CPW10 and the other end connected to a power supply voltage VEE, and can adjust a current amount between the transmission line CPW10 and the power supply voltage VEE.

Figure 13:
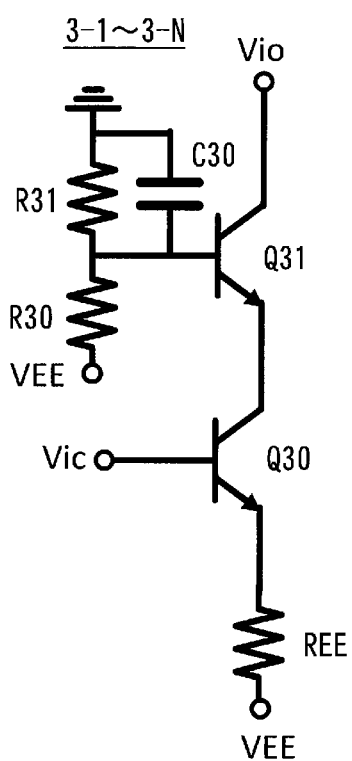
FIG. 13 is a circuit diagram showing a configuration of a unit cell of the distributed amplifier in FIG. 12.
Figure 14:
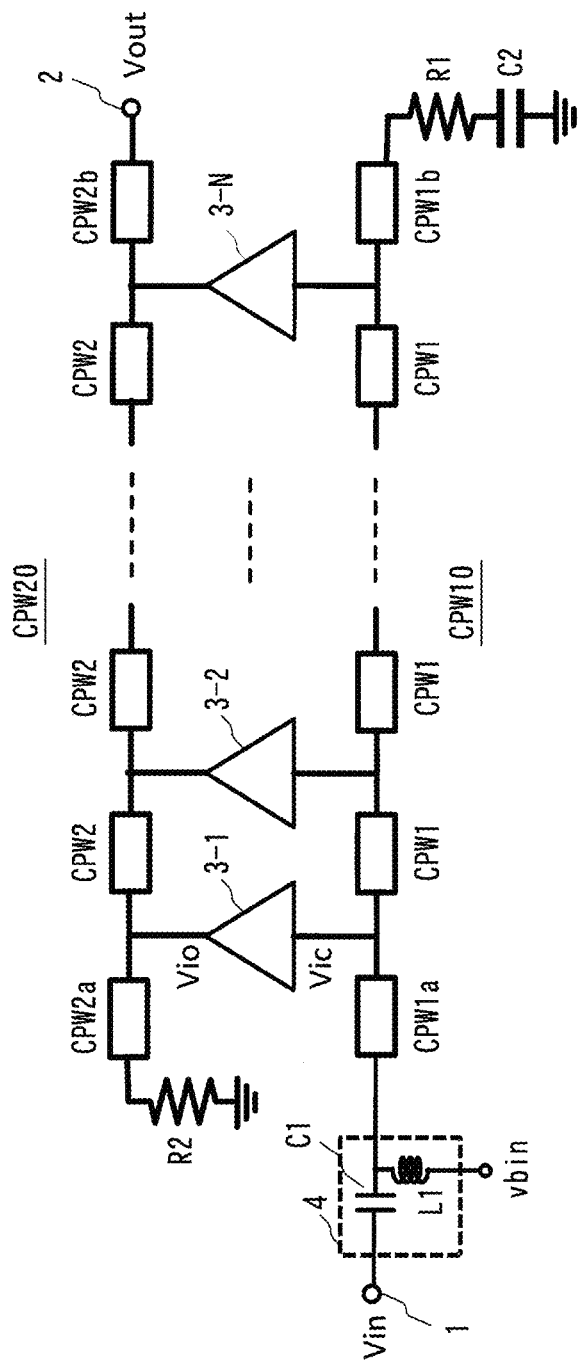
FIG. 14 is a circuit diagram showing another configuration of the conventional distributed amplifier.

In the example of FIG. 1, N stages of unit cells 3 (3-1 to 3-N) are provided (N is an integer not less than 2). In FIG. 1, Vin denotes an input signal to the distributed amplifier, Vout denotes an output signal of the distributed amplifier, Vic denotes an input signal to the unit cell 3 (base voltage of an input transistor), and Vio denotes an output signal of the unit cell 3. The configuration of each unit cell 3 is as shown in FIG. 13.

The transmission line CPW10 is composed by a configuration in which a plurality of transmission lines CPW1a, CPW1 and CPW1b are connected in series. Their characteristic impedances are different between the transmission lines CPW1 between the unit cells and the input-side transmission line CPW1a. The reason is that as to the transmission line CPW1a, the influence of a parasitic capacitance of the DC block 5 or the like on the input side needs to be absorbed by the transmission line CPW1a. Likewise, the characteristic impedances are different between the transmission lines CPW1 and CPW1b. The reason is that as to the transmission line CPW1b, the influence of parasitic capacitances of the input termination resistor R1 and the variable current source IS needs to be absorbed by the transmission line CPW1b.

The transmission line CPW20 is composed by a configuration in which a plurality of transmission lines CPW2a, CPW2 and CPW2b are connected in series. Their characteristic impedances are different between the transmission lines CPW2 between the unit cells and the input-side transmission line CPW2a. The reason is that as to the transmission line CPW2a, the influence of a parasitic capacitance of the output termination resistor R2 needs to be absorbed by the transmission line CPW2a. Likewise, the characteristic impedances are different between the transmission lines CPW2 and CPW2b. The reason is that as to the transmission line CPW2b, the influence of a parasitic capacitance of a circuit or the like downstream of the signal output terminal 2 needs to be absorbed by the transmission line CPW2b.

In the present embodiment, a current amount of the variable current source IS provided between the end terminal of the transmission line CPW10 and the power supply voltage VEE is controlled with a control voltage Vcont, and thereby, a desired bias voltage can be applied to a base terminal of the input transistor of each unit cell 3. Since in the present embodiment, only a small DC current flows in the transmission line CPW10 for a base current of the input transistor of each unit cell 3, a voltage drop in the transmission line CPW10 is very small, and there is almost no decrease in gain of the distributed amplifier caused by the voltage drop.

Moreover, since in the present embodiment, the input termination resistor R1 is directly connected to the ground, reflection properties do not deteriorate. Accordingly, in the present embodiment, the bias voltage can be applied to the input transistor of each unit cell 3 without causing the gain or the reflection properties to deteriorate.

Figure 2:
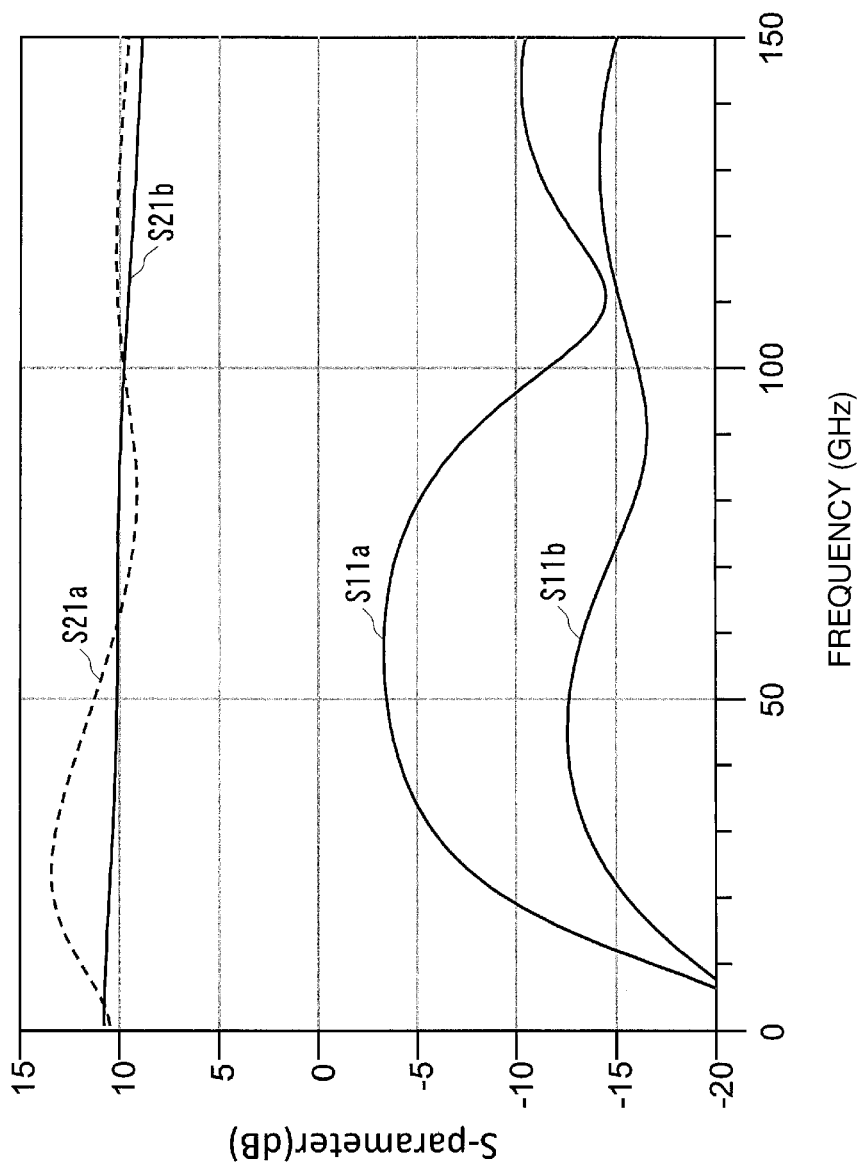
FIG. 2 is a diagram showing simulation results of S-parameters on a conventional distributed amplifier and one according to the first embodiment of the present invention.
Figure 15:
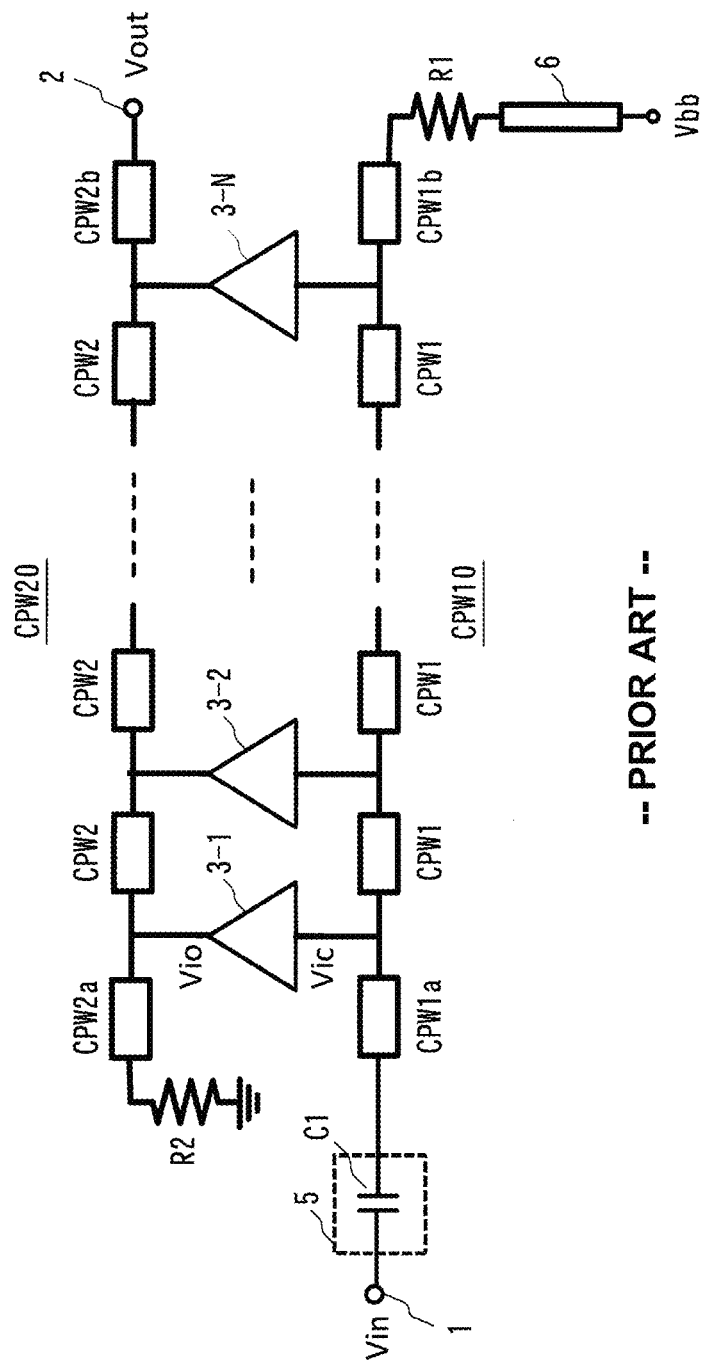
FIG. 15 is a circuit diagram showing another configuration of the conventional distributed amplifier.

FIG. 2 shows simulation results of S-parameters on a conventional distributed amplifier and one of the present embodiment. The conventional distributed amplifier employed the configuration shown in FIG. 15. For both of the conventional one and the one of the present embodiment, N=6 and the input termination resistor R1 was set to be 50Ω. The power supply voltage VEE is −4.4 V of negative voltage. In the conventional distributed amplifier, an inductor with 500 pH simulating the long wire 6 is inserted between the input termination resistor R1 and the terminal to which the bias voltage Vbb is applied. In the distributed amplifier of the present embodiment, 67 mA of current is caused to flow in the variable current source IS such that the same bias voltage as that for the conventional distributed amplifier is applied to the base terminal of the input transistor of each unit cell 3.

In FIG. 2, S11a denotes an S-parameter S11 of the conventional distributed amplifier, S11b denotes an S-parameter S11 of the distributed amplifier of the present embodiment, S21a denotes an S-parameter S21 of the conventional distributed amplifier, and S21b denotes an S-parameter S21 of the distributed amplifier of the present embodiment. It is clear from FIG. 2 that by using the configuration of the present embodiment, reflection properties (S11) more excellent than the conventional ones can be obtained while realizing a gain (S21) equivalent to the conventional one.

Second Embodiment

Figure 3:
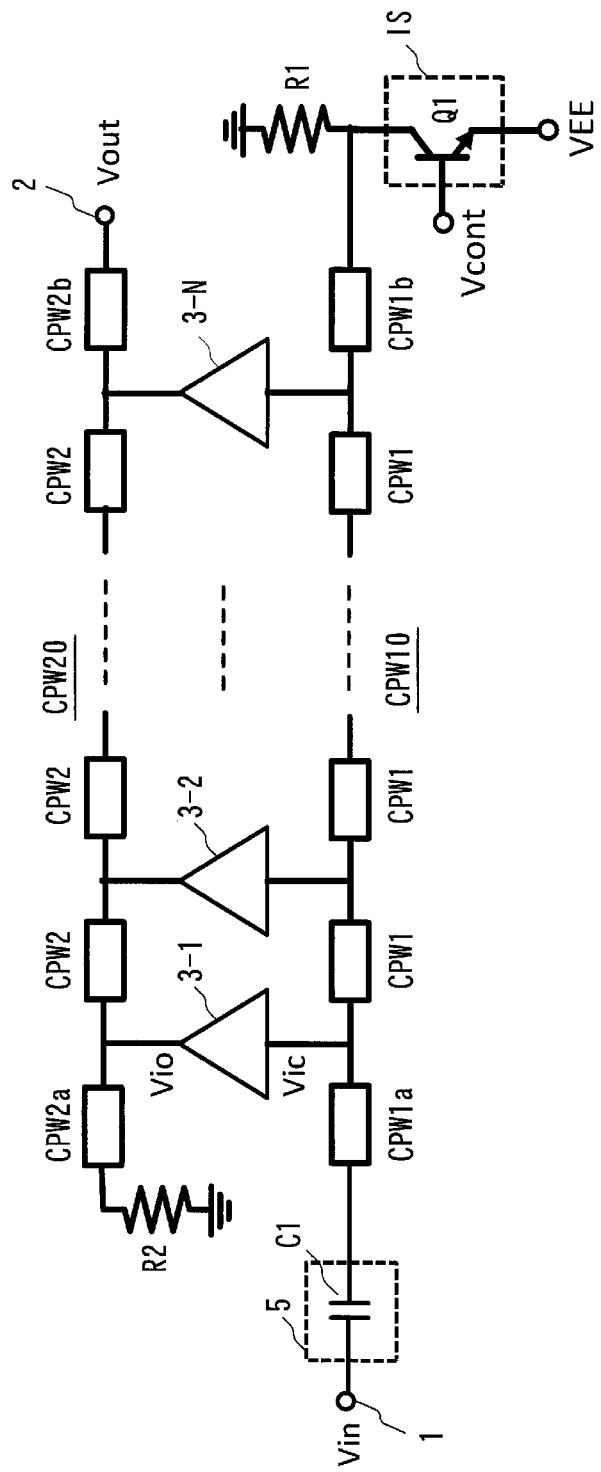
FIG. 3 is a circuit diagram showing a configuration of a distributed amplifier according to a second embodiment of the present invention.

Next, a second embodiment of the present invention is described. FIG. 3 is a circuit diagram showing a configuration of a distributed amplifier according to the second embodiment of the present invention. The present embodiment is a specific example of the first embodiment and employs, as the configuration of the variable current source IS, a configuration which is simplest with a small area among ones which can be realized with one transistor Q1 as shown in FIG. 3. The control voltage Vcont is input to the base terminal of the transistor Q1, and the power supply voltage VEE is applied to the emitter terminal thereof. The collector terminal of the transistor Q1 is connected to the end terminal of the transmission line CPW10.

With the present embodiment, a collector current of the transistor Q1 can be controlled by changing the control voltage Vcont applied to the base terminal of the transistor Q1, and the current amount of the variable current source IS can be controlled.

While in the example of FIG. 3, a bipolar transistor is used as the transistor Q1 realizing the variable current source IS, a MOS transistor may be used. In the case using the MOS transistor, the term "base terminal" in the aforementioned description should be replaced by "gate terminal", "collector terminal" by "drain terminal", and "emitter terminal" by "source terminal".

Figure 4:
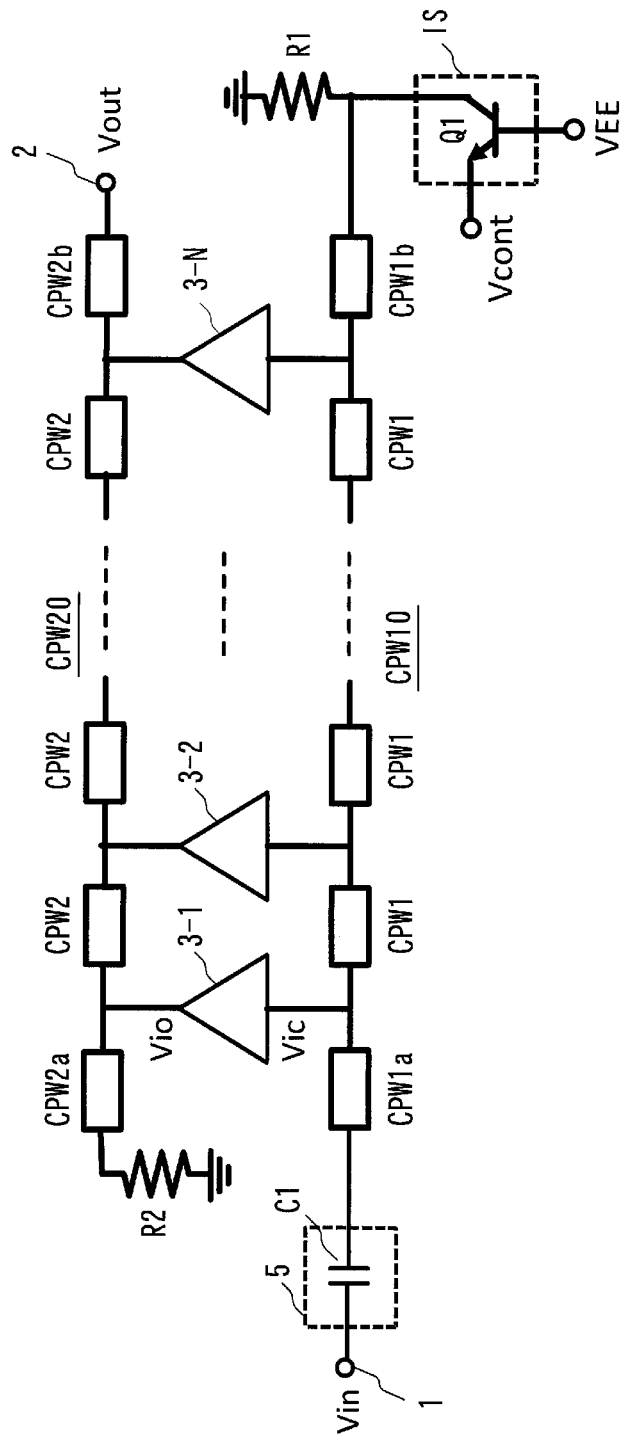
FIG. 4 is a circuit diagram showing another configuration of the distributed amplifier according to the second embodiment of the present invention.

Moreover, while FIG. 3 shows the example in which the emitter terminal of the transistor Q1 is grounded, the voltage of the base terminal being changed, when the layout in FIG. 3 is difficult, the current amount of the variable current source IS may be adjusted by changing the emitter voltage with the base terminal grounded. FIG. 4 shows a configuration of the distributed amplifier in this case.

Third Embodiment

Figure 5:
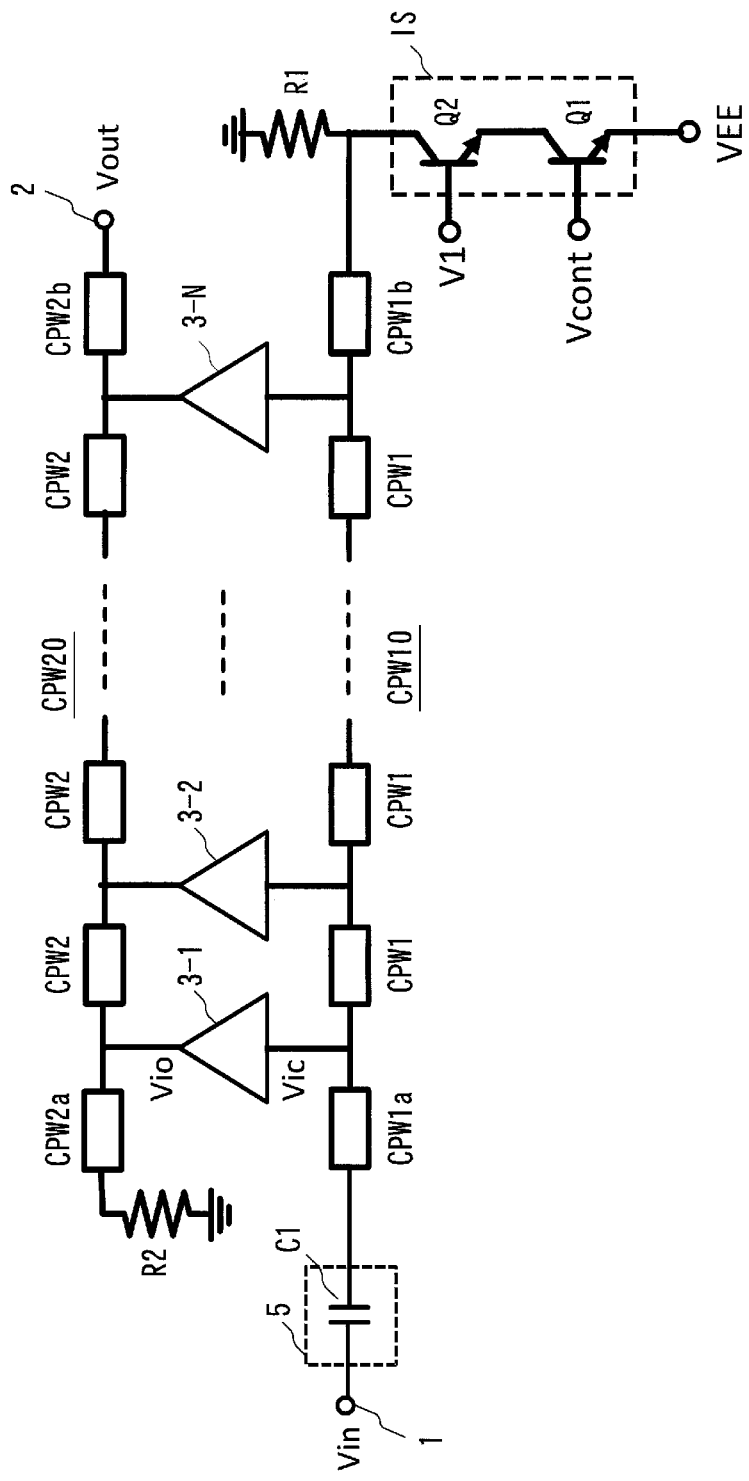
FIG. 5 is a circuit diagram showing a configuration of a distributed amplifier according to a third embodiment of the present invention.

Next, a third embodiment of the present invention is described. FIG. 5 is a circuit diagram showing a configuration of a distributed amplifier according to the third embodiment of the present invention. The present embodiment is another specific example of the first embodiment. The variable current source IS of the present embodiment includes, in addition to the configuration of the second embodiment, a transistor Q2 having a base terminal which a bias voltage V1 is input to, a collector terminal connected to the end terminal of the transmission line CPW10, and an emitter terminal connected to the collector terminal of the transistor Q1. In order to improve the impedance of the variable current source IS, the present embodiment employs a cascode-type variable current source in which the plurality of transistors Q1 and Q2 are longitudinally stacked.

Also with the present embodiment, the current amount of the variable current source IS can be controlled by changing the control voltage Vcont applied to the base terminal of the transistor Q1. The bias voltage V1 is set to be a higher voltage than the control voltage Vcont (voltage between the ground voltage and the control voltage Vcont in the present embodiment).

While FIG. 5 exemplarily shows the case of a two-stage configuration using two transistors, the number of stages of transistors used for the variable current source IS is not limited to two. A configuration including three or more stages is possible when the variable current source IS needs to be improved in impedance.

Fourth Embodiment

Since an ideal variable current source has an infinite impedance, characteristics (the bandwidth and the gain) of a distributed circuit do not deteriorate due to addition of the variable current source. Nevertheless, since an actual variable current source is composed of transistor(s) as either in the second or third embodiment, the parasitic capacitance(s) of the transistor(s) make an impedance on the high frequency side small, which can lead to the cause of the deterioration in characteristics of the distributed circuit (mainly the deterioration of bandwidth characteristics).

Figure 6:
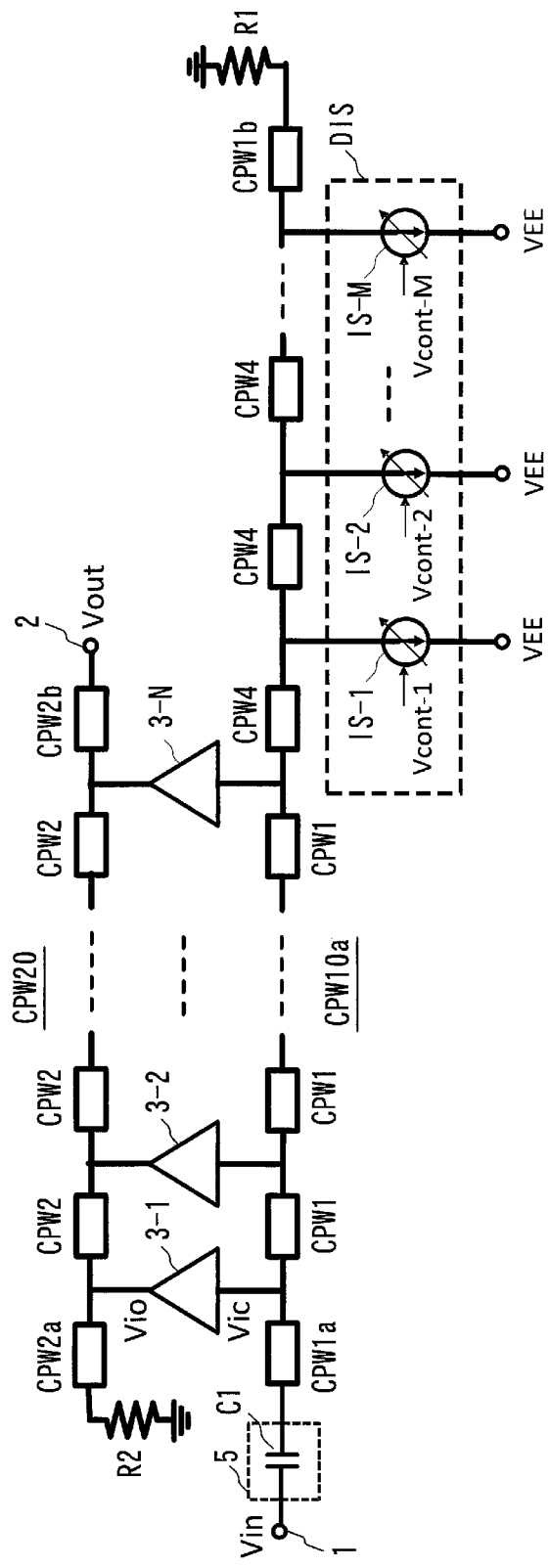
FIG. 6 is a circuit diagram showing a configuration of a distributed amplifier according to a fourth embodiment of the present invention.

In order to eliminate the influence of the parasitic capacitance(s) of the transistor(s), it is desirable to use a distributed variable current source DIS as shown in FIG. 6. The distributed variable current source DIS is arranged at a position downstream of the final-stage unit cell 3-N and upstream of the input termination resistor R1 along a transmission line CPW10a. The distributed variable current source DIS is composed of a plurality of variable current sources IS-1 to IS-M (M is an integer not less than 2) each having one end connected to the transmission line CPW10a and the other end connected to the power supply voltage VEE.

The transmission line CPW10a is composed by a configuration in which a plurality of transmission lines CPW1a, CPW1, CPW4 and CPW1b are connected in series. Their characteristic impedances are different between the transmission lines CPW1 between the unit cells and the transmission lines CPW4 to which the variable current sources IS (IS-1 to IS-M) are connected. The reason is that as to the transmission lines CPW4, the influence of parasitic capacitances of the variable current sources IS (IS-1 to IS-M) needs to be absorbed by the transmission lines CPW4.

As the configuration of the variable current sources IS-1 to IS-M, either configuration described for the second or third embodiment can be used. Similarly to the first embodiment, the current amounts of the variable current sources IS-1 to IS-M may be controlled with control voltages Vcont-1 to Vcont-M such that a desired bias voltage can be applied to the base terminal of the input transistor of each unit cell 3. The values of the control voltages Vcont-1 to Vcont-M may be set to be the same value or may be different values.

Since as in the present embodiment, use of the distributed variable current source DIS makes the influence of the parasitic capacitances of transistors constituting the variable current sources IS-1 to IS-M absorbed with the transmission lines CPW4, deterioration in characteristics of the distributed circuit can be prevented.

For realizing a wide bandwidth, it is desirable to use the variable current sources IS-1 to IS-M that are as small as possible. When bipolar transistors by way of example are used as the variable current sources IS-1 to IS-M, it is desirable to use the transistors that have the smallest emitter length which can be attained by their production process.

Fifth Embodiment

Figure 7:
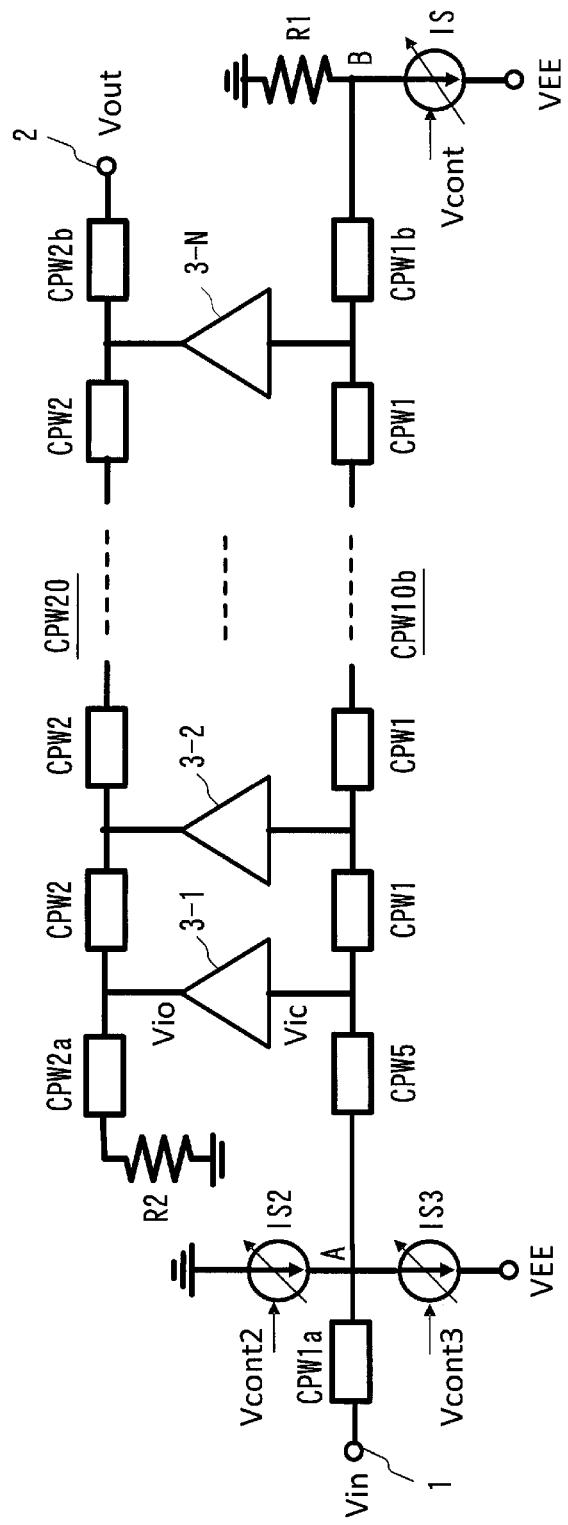
FIG. 7 is a circuit diagram showing a configuration of a distributed amplifier according to a fifth embodiment of the present invention.

Next, a fifth embodiment of the present invention is described. FIG. 7 is a circuit diagram showing a configuration of a distributed amplifier according to the fifth embodiment of the present invention. The distributed amplifier of the present embodiment is composed of: a transmission line CPW10b for input; a transmission line CPW20 for output; an input termination resistor R1; an output termination resistor R2; unit cells 3-1 to 3-N; a variable current source IS; a variable current source IS2; and a variable current source IS3. The variable current source IS2 has one end connected to the ground and the other end connected to the transmission line CPW10b between the signal input terminal 1 and the first-stage unit cell 3-1, and can adjust the current amount between the ground and the transmission line CPW10b. The variable current source IS3 has one end connected to the transmission line CPW10b between the signal input terminal 1 and the first-stage unit cell 3-1 and the other end connected to the power supply voltage VEE, and can adjust the current amount between the transmission line CPW10b and the power supply voltage VEE.

The transmission line CPW10b is composed by a configuration in which a plurality of transmission lines CPW1a, CPW5, CPW1 and CPW1b are connected in series. Their characteristic impedances are different between the transmission lines CPW1 between the unit cells and the transmission line CPW5 to which the variable current sources IS2 and IS3 are connected. The reason is that as to the transmission line CPW5, the influence of parasitic capacitances of the variable current sources IS2 and IS3 needs to be absorbed by the transmission line CPW5.

The present embodiment is an example without a DC block between the signal input terminal 1 and the input end of the transmission line CPW10b. Namely, a DC voltage of a not-shown upstream circuit is input to the distributed amplifier of the present embodiment. In the present embodiment, the two variable current sources IS2 and IS3 are further added to the input side in addition to the variable current source IS, and thereby, a desired bias voltage can be applied to the base terminal of the input transistor of each unit cell 3 without the reflection properties or the gain impaired. The variable current sources IS2 and IS3 can also employ transistors in the similar manner to the variable current source IS.

The adjustment of the variable current source IS is as described for the first embodiment. As to the variable current sources IS2 and IS3, by controlling the current amounts of the variable current sources IS2 and IS3 with respective control voltages Vcont2 and Vcont3, a voltage at a connection point A between the variable current source IS2 and the variable current source IS3 may be made equal to a voltage at a connection point B between the input termination resistor R1 and the variable current source IS. Notably, the configuration, in which the variable current sources IS2 and IS3 are provided in place of providing a DC block, may be applied to the second to fourth embodiments.

Sixth Embodiment

Figure 8:
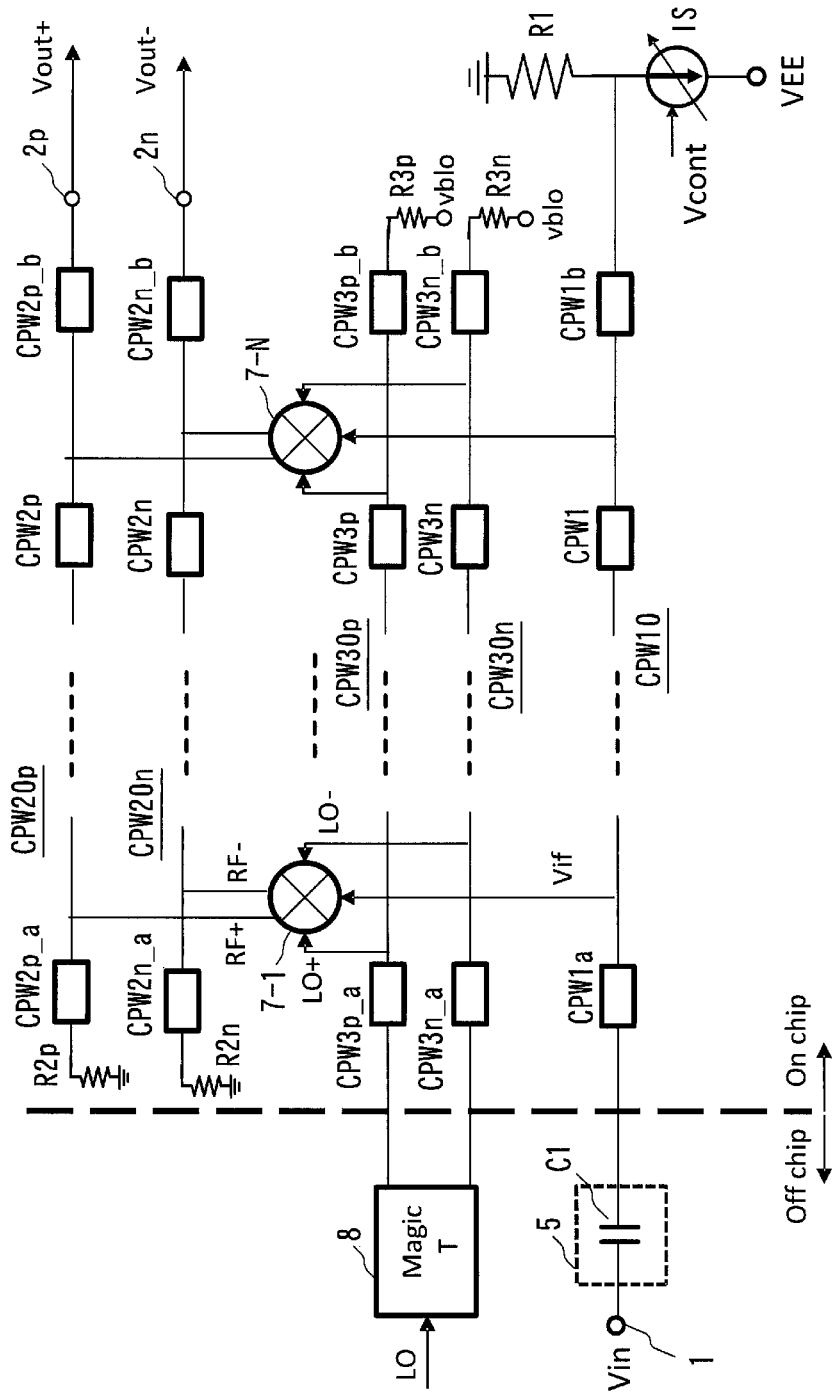
FIG. 8 is a circuit diagram showing a configuration of a distributed mixer according to a sixth embodiment of the present invention.

While for the first to fifth embodiments, distributed amplifiers are exemplarily described as examples of the distributed circuit, the present invention can also be applied to other distributed circuits such, for example, as a distributed mixer. FIG. 8 is a circuit diagram showing a configuration of a distributed mixer according to a sixth embodiment of the present invention. The distributed mixer is composed of: a transmission line CPW10; transmission lines CPW20p and CPW20n for RF signal output; transmission lines CPW30p and CPW30n for LO signal input; an input termination resistor R1; output termination resistors R2p and R2n; termination resistors R3p and R3n; a DC block 5; a plurality of unit cells 7-1 to 7-N; a splitting waveguide 8; and a variable current source IS. The transmission line CPW10 has an input end connected to a signal input terminal (IF terminal) 1. The transmission lines CPW20p and CPW20n have end terminals connected to signal output terminals (RF terminals) 2p and 2n. The input termination resistor R1 connects the end terminal of the transmission line CPW10 and the ground. The output termination resistors R2p and R2n connect input ends of the transmission lines CPW20p and CPW20n and the ground. The termination resistors R3p and R3n connect end terminals of the transmission lines CPW30p and CPW30n and a bias voltage vblo. The DC block 5 is composed of an off-chip capacitor C1 inserted between the signal input terminal 1 and the input end of the transmission line CPW10. The unit cells 7-1 to 7-N are arranged along the transmission lines CPW10, CPW20p, CPW20n, CPW30p and CPW30n, have IF input terminals connected to the transmission line CPW10, LO input terminals connected to the transmission lines CPW30p and CPW30n, and RF output terminals connected to the transmission lines CPW20p and CPW20n. The splitting waveguide 8 splits an LO signal into two to input these to input ends of the transmission lines CPW30p and CPW30n. The variable current source IS has one end connected to the end terminal of the transmission line CPW10 and the other end connected to the power supply voltage VEE, and can adjust the current amount between the transmission line CPW10 and the power supply voltage VEE.

In FIG. 8, Vin denotes an input signal (IF signal) to the distributed mixer, Vout+ denotes an in-phase-side output signal (RF+ signal) of the distributed mixer, Vout− denotes an antiphase-side output signal (RF− signal) of the distributed mixer, LO+ denotes an in-phase-side LO signal, and LO− denotes an antiphase-side LO signal.

Figure 9:
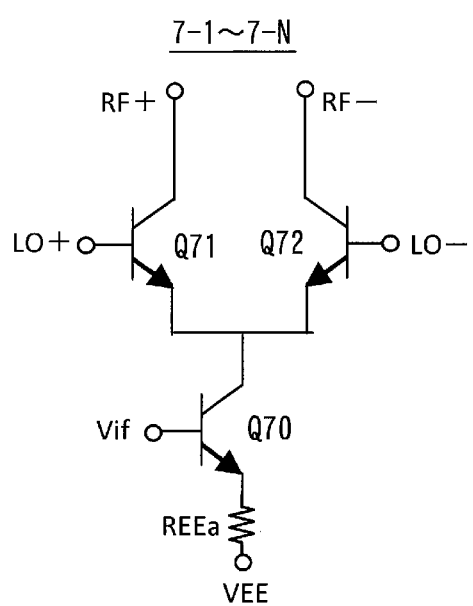
FIG. 9 is a circuit diagram showing a configuration of a unit cell of the distributed mixer according to the sixth embodiment of the present invention.

As shown in FIG. 9, each of the unit cells 7 (7-1 to 7-N) is composed of: an input transistor Q70; output transistors Q71 and Q72; and an emitter resistor REEa. The input transistor Q70 has a base terminal connected to the transmission line CPW10. The output transistors Q71 and Q72 have base terminals connected to the transmission lines CPW30p and CPW30n, collector terminals connected to the transmission lines CPW20p and CPW20n, and emitter terminals connected to a collector terminal of the transistor Q70. The emitter resistor REEa has one end connected to the emitter terminal of the input transistor Q70 and the other end connected to the power supply voltage VEE.

Similarly to the first embodiment, the transmission line CPW10 is composed by a configuration in which a plurality of transmission lines CPW1a, CPW1 and CPW1b are connected in series.

The transmission line CPW20p is composed by a configuration in which transmission lines CPW2p_a, CPW2p and CPW2p_b are connected in series. Their characteristic impedances are different between the transmission lines CPW2p between the unit cells and the input-side transmission line CPW2p_a. The reason is that as to the transmission line CPW2p_a, the influence of a parasitic capacitance of the output termination resistor R2p needs to be absorbed by the transmission line CPW2p_a. Likewise, the characteristic impedances are different between the transmission lines CPW2p and CPW2p_b. The reason is that as to the transmission line CPW2p_b, the influence of a parasitic capacitance of a circuit or the like downstream of the signal output terminal 2p needs to be absorbed by the transmission line CPW2p_b.

Similarly to the transmission line CPW20p, the transmission line CPW20n is composed by a configuration in which a plurality of transmission lines CPW2n_a, CPW2n and CPW2n_b are connected in series.

The transmission line CPW30p is composed by a configuration in which a plurality of transmission lines CPW3p_a, CPW3p and CPW3p_b are connected in series. Their characteristic impedances are different between the transmission lines CPW3p between the unit cells and the input-side transmission line CPW3p_a. The reason is that as to the transmission line CPW3p_a, the influence of a parasitic capacitance of the input-side splitting waveguide 8 or the like needs to be absorbed by the transmission line CPW3p_a. Likewise, the characteristic impedances are different between the transmission lines CPW3p and CPW3p_b. The reason is that as to the transmission line CPW3p_b, the influence of a parasitic capacitance of the termination resistor R3p needs to be absorbed by the transmission line CPW3p_b.

Similarly to the transmission line CPW30p, the transmission line CPW30n is composed by a configuration in which a plurality of transmission lines CPW3n_a, CPW3n and CPW3n_b are connected in series.

Also with the present embodiment, the current amount of the variable current source IS is controlled with the control voltage Vcont, and thereby, a desired bias voltage can be applied to the base terminal of the input transistor Q70 of each unit cell 7.

As above, with the present embodiment, such a bias voltage can be applied to the input transistor Q70 of each unit cell 7 without causing the conversion gain or the reflection properties of the distributed mixer to deteriorate.

Figure 10:
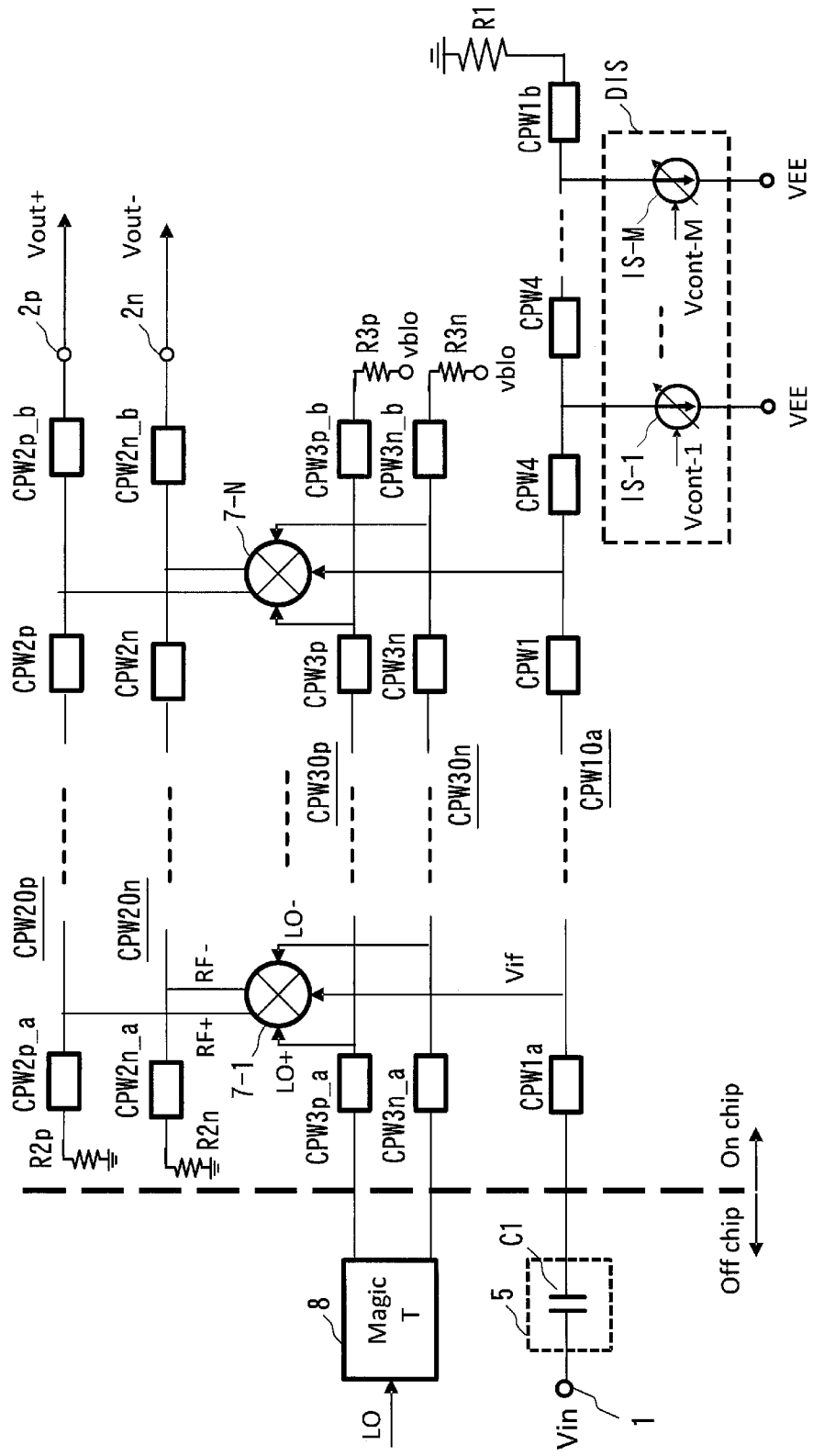
FIG. 10 is a circuit diagram showing another configuration of the distributed mixer according to the sixth embodiment of the present invention.
Figure 11:
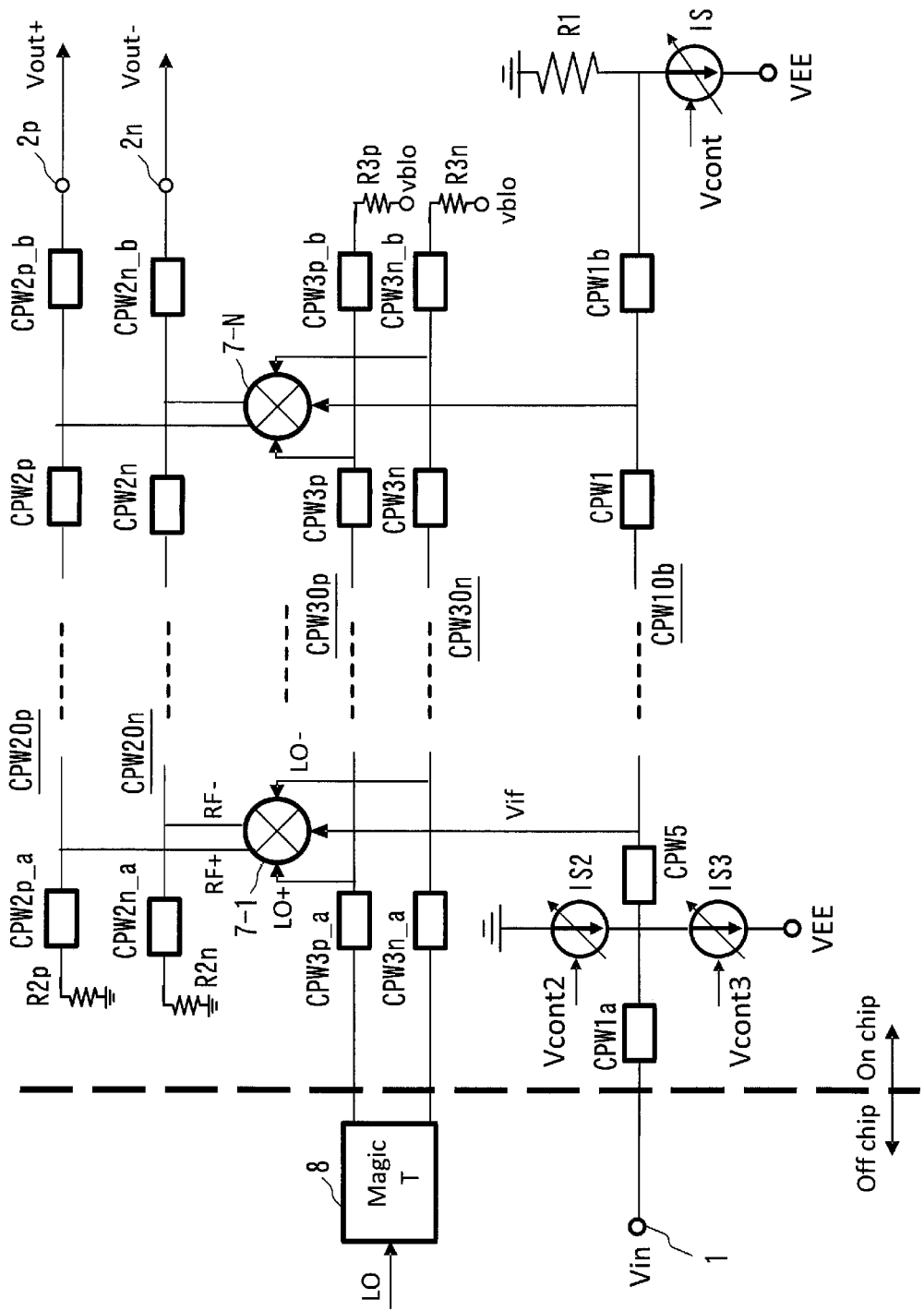
FIG. 11 is a circuit diagram showing another configuration of the distributed mixer according to the sixth embodiment of the present invention.
Figure 12:
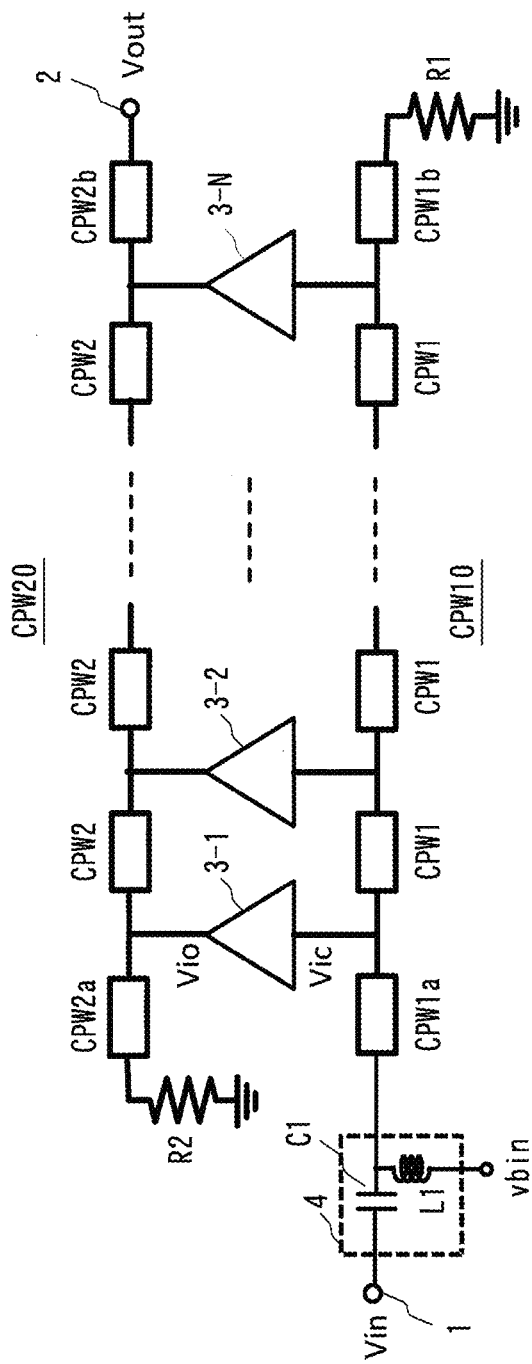
FIG. 12 is a circuit diagram showing a configuration of a conventional distributed amplifier.

FIG. 10 and FIG. 11 show other examples of the distributed mixer. The distributed mixer in FIG. 10 corresponds to the fourth embodiment shown in FIG. 6. The distributed mixer in FIG. 11 corresponds to the fifth embodiment shown in FIG. 7.

While in the first to sixth embodiments, bipolar transistors are exemplarily used as the transistors Q1, Q2, Q30, Q31 and Q 70 to Q72, MOS transistors may be used. In the case using MOS transistors, the term "base terminal" in the aforementioned description should be replaced by "gate terminal", "collector terminal" by "drain terminal", "emitter terminal" by "source terminal", and "emitter resistor" by "source resistor".

Moreover, while the first to sixth embodiments show the cases using CPWs (coplanar waveguides) as the transmission lines, which are not limited to CPWs, other transmission lines such as microstrip lines may be employed as long as they work as transmission lines.

INDUSTRIAL APPLICABILITY

Embodiments of the present invention can be applied to distributed circuits.

REFERENCE SIGNS LIST

1 Signal input terminal
2 Signal output terminal
3, 7 Unit cell
5 DC block
8 Splitting waveguide
CPW1, CPW1a, CPW1b, CPW2, CPW2a, CPW2b, CPW2p, CPW2p_a, CPW2p_b, CPW2n, CPW2n_a, CPW2n_b, CPW3p, CPW3p_a, CPW3p_b, CPW3n, CPW3n_a, CPW3n_b, CPW4, CPW5, CPW10, CPW10a, CPW10b, CPW20, CPW20p, CPW20n, CPW30p, CPW30n Transmission line
Q1, Q2, Q30, Q31, Q70 to Q72 Transistor
R1, R2, R2p, R2n, R3p, R3n, REEa Resistor
C1 Capacitor
IS, IS-1 to IS-M, IS2, IS3 Variable current source
DIS Distributed variable current source.

The invention claimed is:
1. A distributed circuit comprising:
a first transmission line having an input end configured to receive an input signal;
a second transmission line having an output end configured to output an output signal;
a termination resistor connected to an end terminal of the first transmission line;
an output termination resistor connecting an input end of the second transmission line to ground;
a plurality of unit cells arranged along the first and second transmission lines, each of the plurality of unit cells having an input terminal connected to the first transmission line and output terminal connected to the second transmission line; and
a first variable current source having a first end connected to the end terminal of the first transmission line and a second end connected to a power supply voltage,
wherein:
the first variable current source is configured to adjust an amount of current between the first transmission line and the power supply voltage, and
the first variable current source comprises a plurality of variable current sources arranged at a position downstream of a final-stage unit cell of the plurality of unit cells and upstream of the termination resistor along the first transmission line, each of the plurality of variable current sources having a first end connected to the first transmission line and a second end connected to the power supply voltage, and each of the plurality of variable current sources being configured to adjust the amount of current between the first transmission line and the power supply voltage.

2. The distributed circuit according to claim 1, wherein the first variable current source comprises:
a transistor having a base terminal or a gate terminal that a control voltage for adjusting the amount of current is input to;
a collector terminal or a drain terminal connected to the first transmission line; and
an emitter terminal or a source terminal connected to the power supply voltage.

3. The distributed circuit according to claim 1, wherein the first variable current source comprises:
a transistor having a base terminal or a gate terminal that the power supply voltage is input to;
a collector terminal or a drain terminal connected to the first transmission line; and
an emitter terminal or a source terminal that a control voltage for adjusting the amount of current is input to.

4. The distributed circuit according to claim 1, wherein the first variable current source comprises a cascode-type variable current source obtained by cascode connection of a plurality of transistors and provided between the end terminal of the first transmission line and the power supply voltage.

5. The distributed circuit according to claim 1, further comprising a capacitor between a signal input terminal that the input signal is input to and the input end of the first transmission line.

6. The distributed circuit according to claim 1, further comprising:
a second variable current source having a first end connected to ground and a second end connected to the first transmission line between a signal input terminal and a first-stage unit cell of the plurality of unit cells, the second variable current source being configured to adjust an amount of current between the ground and the first transmission line; and
a third variable current source having a first end connected to the first transmission line between the signal input terminal and the first-stage unit cell and a second end connected to the power supply voltage, the third variable current source being configured to adjust the amount of current between the first transmission line and the power supply voltage.

7. The distributed circuit according to claim 1, wherein each of the first and second transmission lines comprises a plurality of transmission lines connected in series, wherein each of the plurality of transmission lines have a same characteristic impedance.

8. The distributed circuit according to claim 1, wherein each of the first and second transmission lines comprises a plurality of transmission lines connected in series, wherein each of the plurality of transmission lines is different in characteristic impedances.

9. A method comprising:
receiving, by an input end of a first transmission line, an input signal, wherein a termination resistor is connected to an end terminal of the first transmission line;
outputting, by an output end of a second transmission line, an output signal, wherein:
an output termination resistor connects an input end of the second transmission line to ground; and
a plurality of unit cells is arranged along the first and second transmission lines, each of the plurality of unit cells having an input terminal connected to the first transmission line and output terminal connected to the second transmission line; and
adjusting, via a first variable current source, an amount of current between the first transmission line and a power supply voltage, the first variable current source having a first end connected to the end terminal of the first transmission line and a second end connected to the power supply voltage,
wherein the first variable current source comprises a plurality of variable current sources arranged at a position downstream of a final-stage unit cell of the plurality of unit cells and upstream of the termination resistor along the first transmission line, each of the plurality of variable current sources having a first end connected to the first transmission line and a second end connected to the power supply voltage, and each of the plurality of variable current sources being configured to adjust the amount of current between the first transmission line and the power supply voltage.

10. The method according to claim 9, wherein the first variable current source comprises:
a transistor having a base terminal or a gate terminal that a control voltage for adjusting the amount of current is input to;
a collector terminal or a drain terminal connected to the first transmission line; and
an emitter terminal or a source terminal connected to the power supply voltage.

11. The method according to claim 9, wherein the first variable current source comprises:
a transistor having a base terminal or a gate terminal that the power supply voltage is input to;
a collector terminal or a drain terminal connected to the first transmission line; and
an emitter terminal or a source terminal that a control voltage for adjusting the amount of current is input to.

12. The method according to claim 9, wherein the first variable current source comprises a cascode-type variable current source obtained by cascode connection of a plurality of transistors and provided between the end terminal of the first transmission line and the power supply voltage.

13. The method according to claim 9, wherein a capacitor is connected between a signal input terminal that the input signal is input to and the input end of the first transmission line.

* * * * *